（12）United States Patent
Foss (10) Patent No.: US 10,949,204 B2
(45) Date of Patent: Mar. 16, 2021

(54) MICROCONTROLLER WITH CONFIGURABLE LOGIC PERIPHERAL

(71) Applicant: Microchip Technology Incorporated, Chandler, AZ (US)

(72) Inventor: Ryan Foss, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 2 days.

(21) Appl. No.: 16/568,058

(22) Filed: Sep. 11, 2019

(65) Prior Publication Data

US 2020/0401407 A1 Dec. 24, 2020

Related U.S. Application Data

(60) Provisional application No. 62/864,198, filed on Jun. 20, 2019.

(51) Int. Cl.
*G06F 9/30* (2018.01)
*G11C 8/10* (2006.01)
*G06F 13/28* (2006.01)

(52) U.S. Cl.
CPC ...... *G06F 9/30101* (2013.01); *G06F 9/30029* (2013.01); *G06F 13/287* (2013.01); *G11C 8/10* (2013.01)

(58) Field of Classification Search
CPC . G06F 9/30029; G06F 9/30101; G06F 13/287
See application file for complete search history.

(56) References Cited

U.S. PATENT DOCUMENTS

| 6,145,020 A * | 11/2000 | Barnett | G06F 15/7867 326/39 |
| 6,188,241 B1 * | 2/2001 | Gauthier | G06F 15/7867 326/38 |
| 7,242,218 B2 * | 7/2007 | Camarota | H03K 19/17768 326/41 |
| 7,352,206 B1 * | 4/2008 | Zhu | G01K 7/015 326/38 |
| 9,432,298 B1 * | 8/2016 | Smith | H04L 49/9057 |

(Continued)

OTHER PUBLICATIONS

Bekken, Kristian Saxrud, "AN2434: Interfacing Quadrature Encoder using CCL with TCA and TCB," Microchip Technology Incorporated, URL: http://ww1.microchip.com/downloads/en/Appnotes/Interf-Quad-Encoder-CCL-w-TCA-TCB-DS00002434C.pdf, 27 pages, May 15, 2019.

(Continued)

*Primary Examiner* — Jason Crawford
(74) *Attorney, Agent, or Firm* — Slayden Grubert Beard PLLC (57) ABSTRACT

A microcontroller has a central processing unit, memory, I/O ports and a plurality of peripheral units, wherein one of the peripheral units is a configurable logic cell. The configurable logic cell is formed by a look-up table formed by a plurality of memory cells receiving a predefined number of input address signals selectable from internal signals provided by the peripheral units and at least one external signal provided by at least one external pin and generating an output signal. The central processing unit is configured to directly provide input address signals for the look-up table.

21 Claims, 5 Drawing Sheets

(56) References Cited

U.S. PATENT DOCUMENTS

| | | | | |
|---|---|---|---|---|
| 2001/0027499 | A1* | 10/2001 | Barry | G06F 13/28 |
| | | | | 710/26 |
| 2005/0102573 | A1* | 5/2005 | Sun | G06F 15/7842 |
| | | | | 714/30 |
| 2008/0263334 | A1* | 10/2008 | Synder | H03K 19/177 |
| | | | | 712/221 |
| 2010/0122007 | A1* | 5/2010 | Lahti | G06F 13/24 |
| | | | | 710/262 |
| 2012/0268163 | A1 | 10/2012 | Kilzer et al. | 326/37 |
| 2018/0240032 | A1* | 8/2018 | van Rooyen | G06N 7/005 |

OTHER PUBLICATIONS

Pop, Cristian, "TB3218: Getting Started with CCL," Microchip Technology Incorporated, URL: http://ww1.microchip.com/downloads/en/AppNotes/TB3218-Getting-Started-with-CCL-90003218A.pdf, 28 pages, May 23, 2019.

International Search Report and Written Opinion, Application No. PCT/US2019/066709, 13 pages, dated Apr. 15, 2020.

Sridhar, Swathi, "TB3133: Configurable Logic Cell on PIC® Microcontrollers," Microchip Technology Incorporated, URL: http://ww1.microchip.com/downloads/en/AppNotes/90003133A.pdf, 12 pages, Jan. 27, 2015.

* cited by examiner

MICROCONTROLLER WITH CONFIGURABLE LOGIC PERIPHERAL

RELATED APPLICATIONS

The present application claims priority to U.S. Provisional Application No. 62/864,198 filed Jun. 20, 2019, the contents of which are hereby incorporated in their entirety.

TECHNICAL FIELD

The present disclosure relates to microcontrollers with configurable logic cells and, more particularly, to a microcontroller with combinatorial logic peripherals.

BACKGROUND

A microcontroller may comprise a central processing unit (CPU), program and data storage memory, input-output (I/O) ports and a plurality of peripherals fabricated on an integrated circuit (IC) die ("chip"). The IC die may be enclosed (encapsulated) in an IC package having connection terminals ("pins") to which external circuits may be connected to the IC die. Electrical connection points on the IC die may be "pads" and may be connected to the IC package pins with bonding wires. The IC die pads are used for the I/O ports, and IC die DC power and ground. Some of these peripherals may be core independent peripherals (CIPs), i.e. a peripheral that does not rely on input from the CPU for operation.

Configurable logic cell peripherals in microcontrollers are known from a variety of microcontrollers manufactured by the Assignee of the present application. For example, application note TB3133, by Swathi Sridar, published in 2015 describes configurable logic cells available in PIC© Microcontrollers and is hereby incorporated by reference. These devices are versatile and provide a selectable logic function to a microcontroller without the complexity of typical FPGAs that also may incorporate a central processing unit. These logic cell peripherals are small in comparison to the real estate required by FPGAs and enhance the microcontrollers such that in many applications no additional or very little additional external logic is necessary.

Many microcontrollers comprise these core-independent peripherals and can provide for up to 8 configurable logic cells. Each configurable logic cell (CLC) can be configured from 8 different options as shown in FIG. 3 of TB3133. Certain configurations have a limited sequential functionality by implementing or adding a Flip-Flop function. Thus, these microcontrollers offer the popular CLC peripheral for implementing simple combinational and sequential logic functions. However, the combinational elements in particular require complicated setup and provide limited options. Many Application Notes are forced to use multiple CLC peripherals to create the combinational logic system required. The CLC is a powerful and versatile peripheral and having to allocate one for simple bridging needs may often be wasteful.

Thus, there are certain restriction and limitations as, e.g., only a predefined number of logic elements is available in a logic cell.

SUMMARY

Therefore, what is needed is a more flexible logic cell peripheral. According to an embodiment, a microcontroller may comprise a central processing unit, memory, I/O ports and a plurality of peripheral units, wherein one of the peripheral units is a configurable logic cell, wherein the configurable logic cell is formed by a look-up table formed by a plurality of memory cells receiving a predefined number of input address signals selectable from a plurality of internal signals provided by the peripheral units or external signals provided by at least one external pin and generating an output signal and wherein the central processing unit is configured to directly provide at least one input signal for the look-up table.

According to a further embodiment, the configurable logic cell may comprise an input multiplexer unit configured to select the predefined number of said input signals from said internal and external signals of the microcontroller and further comprises a special function input register coupled between the output of the input multiplexer and an address input of the look-up table, wherein the special function input register receives and buffers the selected input signals and wherein the central processing unit is configured to write to the special function input register.

According to a further embodiment, the configurable logic cell may comprise an input multiplexer unit configured to select the predefined number of input signals from said internal and external signals of the microcontroller and further comprises a special function input register coupled with inputs of the input multiplexer unit wherein the central processing unit is configured to write to the special function input register to directly provide input signals to the look-up table.

According to an embodiment, a microcontroller may comprise a central processing unit, memory, I/O ports and a plurality of peripheral units, wherein one of the peripheral units is a configurable logic cell, wherein the configurable logic cell is formed by a look-up table formed by a plurality of memory cells receiving a predefined number of input address signals selectable from internal signals provided by the peripheral units and at least one external signal provided by at least one external pin and generating an output signal and wherein the central processing unit is configured to directly provide input address signals for the look-up table.

According to a further embodiment, the configurable logic cell may comprises an input multiplexer circuit configured to select the predefined number of input address signals from said internal signals and the at least one external signal and further comprises a special function input register coupled between outputs of the input multiplexer circuit and an address input of the look-up table, wherein the special function input register receives and buffers the selected input signals and wherein the central processing unit is configured to read from and write to the special function input register. According to a further embodiment, the configurable logic cell may comprises an input multiplexer circuit configured to select the predefined number of input signals from said internal signals and the at least one external signal and further comprises a special function input register coupled with inputs of the input multiplexer circuit wherein the central processing unit is configured to read from and write to the special function input register to directly provide input signals to the look-up table. According to a further embodiment, the special function registers may be memory mapped to a data memory. According to a further embodiment, the look-up table may comprise a plurality of 1-bit memory cells. According to a further embodiment, the plurality of 1-bit memory cells can be memory-mapped to the data memory or to the program memory which may be flash memory. According to a further embodiment, the microcontroller may further comprise a direct memory access controller configurable to transfer data into the plurality of 1-bit memory cells. According to a further embodiment, the microcontroller may further comprise a multiplexer having a plurality of inputs coupled with the plurality of 1-bit memory cells, wherein the multiplexer is controlled to select an output of one of the memory cells corresponding to said input address signals. According to a further embodiment, the microcontroller may further comprise an address decoder configured to select one of the memory cells corresponding to input address signals received at the address decoder. According to a further embodiment, the microcontroller may further comprise a logic circuit being coupled with an output of the look-up table. According to a further embodiment, the logic circuit may comprise a mode multiplexer having a first input coupled with the output of the look-up table, a second input coupled with an output of a first flip-flop, wherein a data input of the first flip flop is coupled with the output of the look-up table and a clock input of the flip-flop is coupled with a clock input of the logic circuit, wherein the mode multiplexer is controlled by a mode register. According to a further embodiment, the multiplexer may comprise a third input coupled with an output of an AND gate, the AND gate having a first input coupled with the clock input and a second input coupled with an output of a second flip-flop, wherein a data input of the second flip-flop is coupled with output of the look-up table and a clock input of the second flip-flop is coupled with an output of an XOR gate, wherein a first input of the XOR gate is coupled with the clock input and a second input of the XOR gate is coupled with the output of the second flip-flop.

According to another embodiment, a method of operating a microcontroller comprising a central processing unit, memory, I/O ports and a plurality of peripheral units, wherein one of the peripheral units is a configurable logic cell, wherein the configurable logic cell is formed by a look-up table formed by a plurality of memory cells receiving a predefined number of input address signals and generating an output signal and wherein the central processing unit is configured to directly provide input address signals for the look-up table, may comprise: configuring the look-up table by loading predefined data into memory cells of the look-up table; selecting address signals from internal signals provided by the peripheral units and external signals provided by at least one external pin; buffering the selected address signals in a register or latch.

According to a further embodiment, the method may further comprise overwriting the register or latch by the central processing unit under program control. According to a further embodiment, configuring the look-up table can be performed by transferring data into the memory cells by the central processing unit or a DMA controller. According to a further embodiment, configuring the look-up table can be performed by memory-mapping the memory cells to a flash memory and by programming the microcontroller.

BRIEF DESCRIPTION OF THE DRAWINGS

A more complete understanding of the present disclosure may be acquired by referring to the following description taken in conjunction with the accompanying drawings. Similar numerals refer to similar elements throughput drawings, wherein.

DETAILED DESCRIPTION

Figure 1:
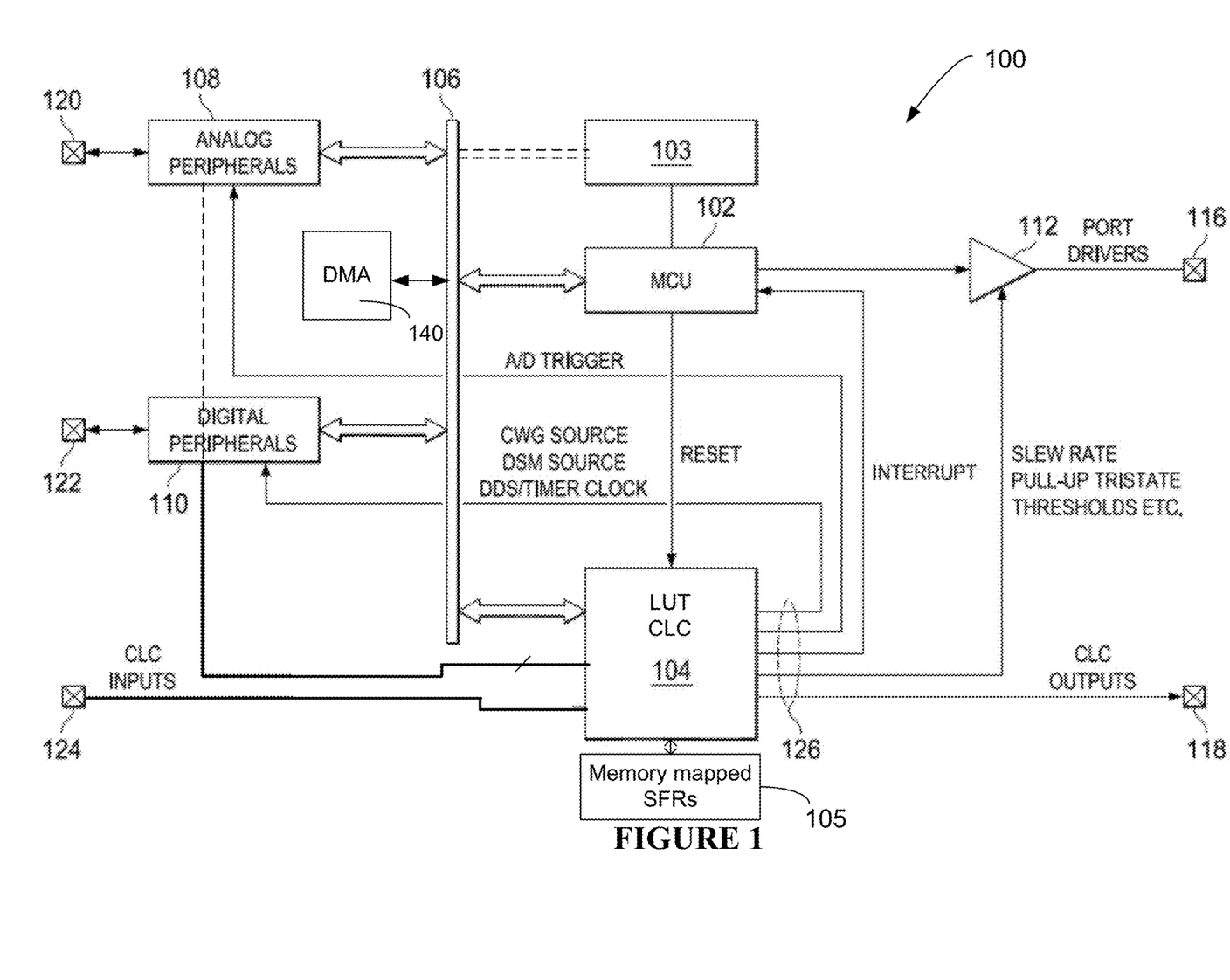
FIG. 1 illustrates a microcontroller with a look-up table—configurable logic cell peripheral according to an embodiment.

Turning now to the drawings and, with particular attention to FIG. 1, a diagram of a microcontroller 100 according to an embodiment of the present invention is shown. The microcontroller 100 includes a processor core (MCU) or CPU 102, which may be embodied as a RISC core. The processor core 102 couples, typically via a bus 106, to one or more on-chip peripheral devices, such as analog peripherals 108 and digital peripherals 110. These peripherals 108, 110 may connect through one or more external pin connections 120, 122 to external circuitry and receive input signals and/or generate output signals through these respective pins. However, some peripherals may not require or generate any external signals or may receive only one or more input signals or generate only one or more output signals. The MCU (or CPU) is further coupled with a memory block 103 either through bus 106 as indicated by the dashed lines or through a separate memory bus. The memory block 103 may include separate data (RAM) and program memory (ROM or Flash memory) depending on the implementation architecture. According to an embodiment, special function registers of the various peripherals used for configuration and data transfer may be memory mapped to the data memory. A plurality of external pins 116, 118, 120, 122, 124 may be provided. Each of these pins may be a multi-function pin and coupled with an I/O port and respective multiplexers (not shown) to provide the multi-function of the respective pin. FIG. 1 shows only one configuration in which pin 120 is used as an analog input pin for analog peripheral 108, pin 122 as a digital input pin for digital peripheral 110, pin 124 and 118 as an input and output pins for a look-up table (LUT)-CLC 104, and pin 116 as a general purpose I/O pin.

A direct memory access (DMA) controller 140 may be implemented according to various embodiments and be coupled with the system bus 106. Such a DMA controller 140 may be configurable to transfer data between memory block 103 and any peripherals including the LUT CLC peripheral 104 or between any of the various peripherals.

A variety of general purpose I/O ports which form the basic I/O interface of a microcontroller may be provided for all external pins. FIG. 1 merely shows an output driver 112 coupled with external pin 116. However, as understood in the art, a GPIO port may include input and output drivers as well as multiplexers to operate as a multi-function pin and thus, external pins may share their function with various peripherals under program control.

In addition, as will be explained in greater detail below, each LUT-CLC 104 comprises a look-up table (LUT) instead of actual logic components which will be explained in more detail below. Each LUT-CLCs 104 functions as a peripheral device and is coupled to the bus 106. According to various embodiments each LUT-CLC 104 may include or be associated with one or more special function registers (SFRs) 105 for further configuration as will be explained in more detail below. Moreover, the LUT may be formed by a block of dedicated memory cells wherein these cells can also be memory mapped to the data memory 103. Alternatively, these dedicated memory cells can be loaded through the CPU 102 under program control or configured by copying the content of a dedicated RAM or Flash region of memory block 103 into the cells. According to one embodiment, the LUT-CLC 104 dedicated memory cells may be memory mapped into the data memory or the Flash memory and thus could be configured directly by the CPU 102 or by programming the microcontroller 100. In case of memory mapping the dedicated memory cells of LUT-CLC 104 to the Flash memory, the Flash memory writing routines provided by the microcontroller 102 may be used to re-configure or initialize a LUT of LUT-CLC 104. In particular, DMA controller 140 as mentioned above may be configurable to transfer data into the memory cells of the LUT of LUT-CLC 104.

The dedicated registers 105 of the LUT-CLCs 104 are addressable like other peripheral devices, for example through memory-mapping, and can provide logic functions for a system or an application. These can include, for example, any logic function which will be provided by the look-up tables as will be explained in more detail below.

In the embodiment illustrated, the LUT-CLC 104 can receive inputs from any of the digital or analog peripherals 108, 110 via bus 105, as well as external signals provided through one or more pins 124 and a reset from the processor core 102. As mentioned above, the pins 124 may share their function with a GPIO port pin according to various embodiments. These peripherals can include, for example, pulse width modulation (PWM) source, complementary waveform generator (CWG) source, DSM source, and DDS/Timer clock inputs or any other suitable peripheral. In general, inputs can come from I/O pins, any peripherals, and/or internal clocks. As will be explained in more detail, a variety of internal and external input signals may be selectable through an input multiplexer (not shown in FIG. 1) and available to provide an address to the look-up table within LUT-CLC 104 which then generates an associated output signal depending on a programming of the look-up table, thus, implementing the desired logic function. The output signal may be either a single signal that can be routed to a destination through a multiplexer (not shown) or multiple output signals that may be selected by a respective recipient. FIG. 1 shows multiple output signals 126. First and second output signals of signals 126 may be a trigger, such as an A/D trigger, or a control signal for respective analog or digital peripherals 108, 110. A third output signal may provide an interrupt to the CPU 102. A fourth output signal may control an output driver of a general purpose I/O port 112. A fifth output may be routed directly or through a driver (not shown) to an external pin 118. Additional outputs and output functions such as slew rate, pull-up tristate thresholds, etc., can be provided to port drivers 112, while others can be provided to pins that are configured as external pins 118.

FIG. 1 shows one exemplary configuration. However, in general, the LUT-CLC 104 can receive inputs from any subsystem such as a digital peripheral, I/O port, or internal status bits, or reset signals, including for example, oscillator output, system clocks, etc., and provides outputs to I/O pins, peripherals, a processor core interrupt, I/O port control functions, status signals, system clock, and even to other LUT-CLCs 104, or conventional CLCs.

As noted above, in some embodiments, the LUT-CLC 104 is addressed like other peripheral devices and may be configured at run-time through bus 106 and/or through memory-mapping. In some embodiments, the LUT-CLC 104 may be configured at run time using one or more special function registers 105. Thus, the LUT-CLC 104 is fully integrated into the processor address and data bus. Configuration can be applied statically or updated in real time based on the needs of the application.

In some embodiments, configuration of the LUT of the LUT-CLC 104 can come from software registers or non-volatile memory. In some embodiments, the non-volatile memory may be read and data transferred to the LUT of the LUT-CLC 104 through the CPU 102 or a DMA controller 140. In others, the non-volatile memory may be statically connected for configuration. Further, in some embodiments, after an initial configuration, software may update the configuration.

Conventional microcontrollers with a CLC do not provide any mechanism to directly provide input to a CLC from software without routing through a different pin or peripheral first. In other words, there is no input override functionality. Rather, the CPU can only select input signals from a variety of available input signals but has no means to directly provide an input signal.

Figure 2:
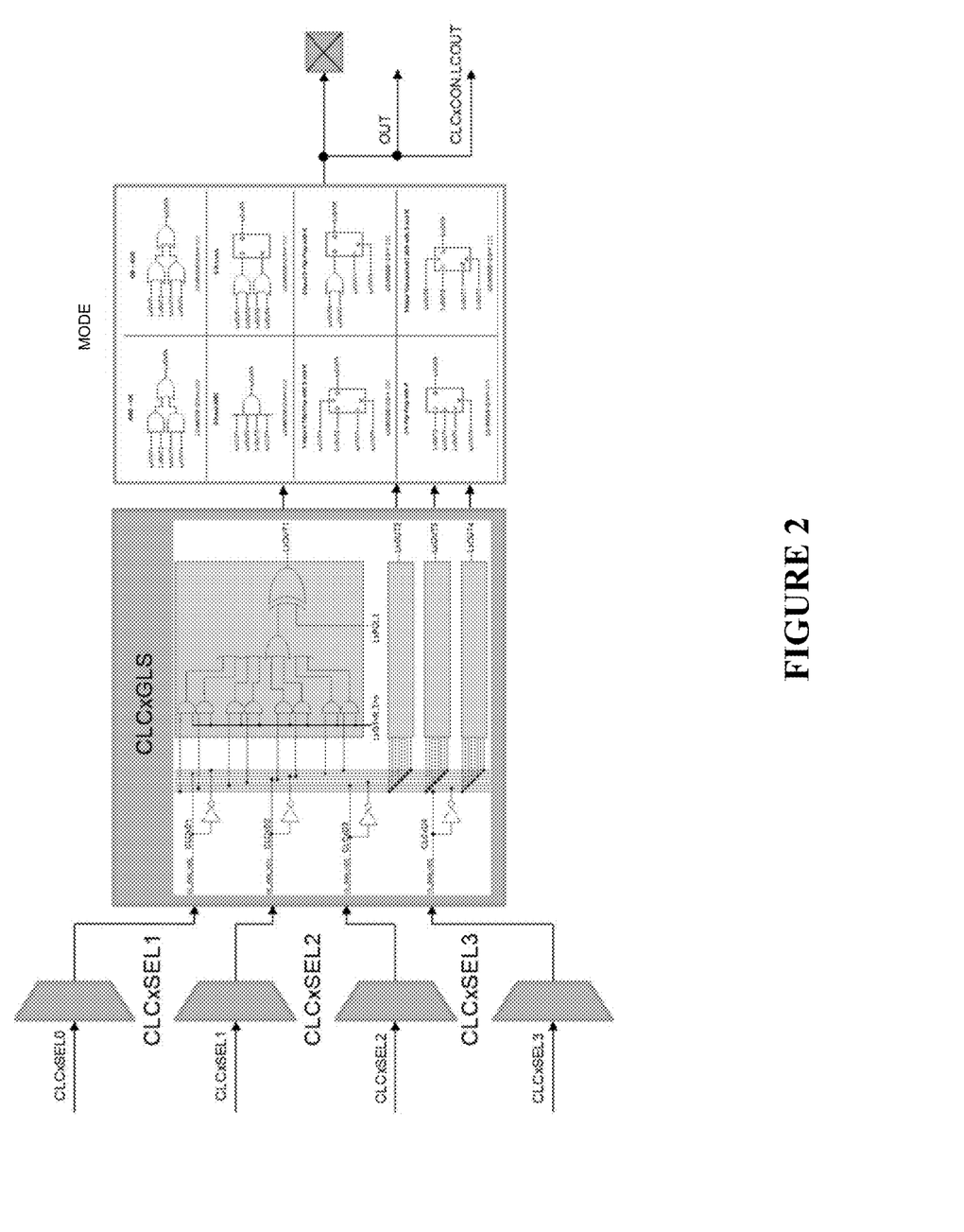
FIG. 2 illustrates a conventional microcontroller with a configurable logic cell peripheral.

FIG. 2 shows a conventional CLC peripheral with input multiplexers CLCxSELy and input selection unit CLCxGLS which selects various input signals. Configuration is provided through special function registers (not shown) which control block MODE and which provide for a fixed number of different configurations as shown in the block MODE. The selectable options are restricted to the eight different configurations shown. No other logic function than those eight functions are available. Some other signal conditioning may be present. The output signal (OUT or CLCxCON.LCOUT) can be routed internally or provided to an external pin as shown in FIG. 2.

Figure 3:
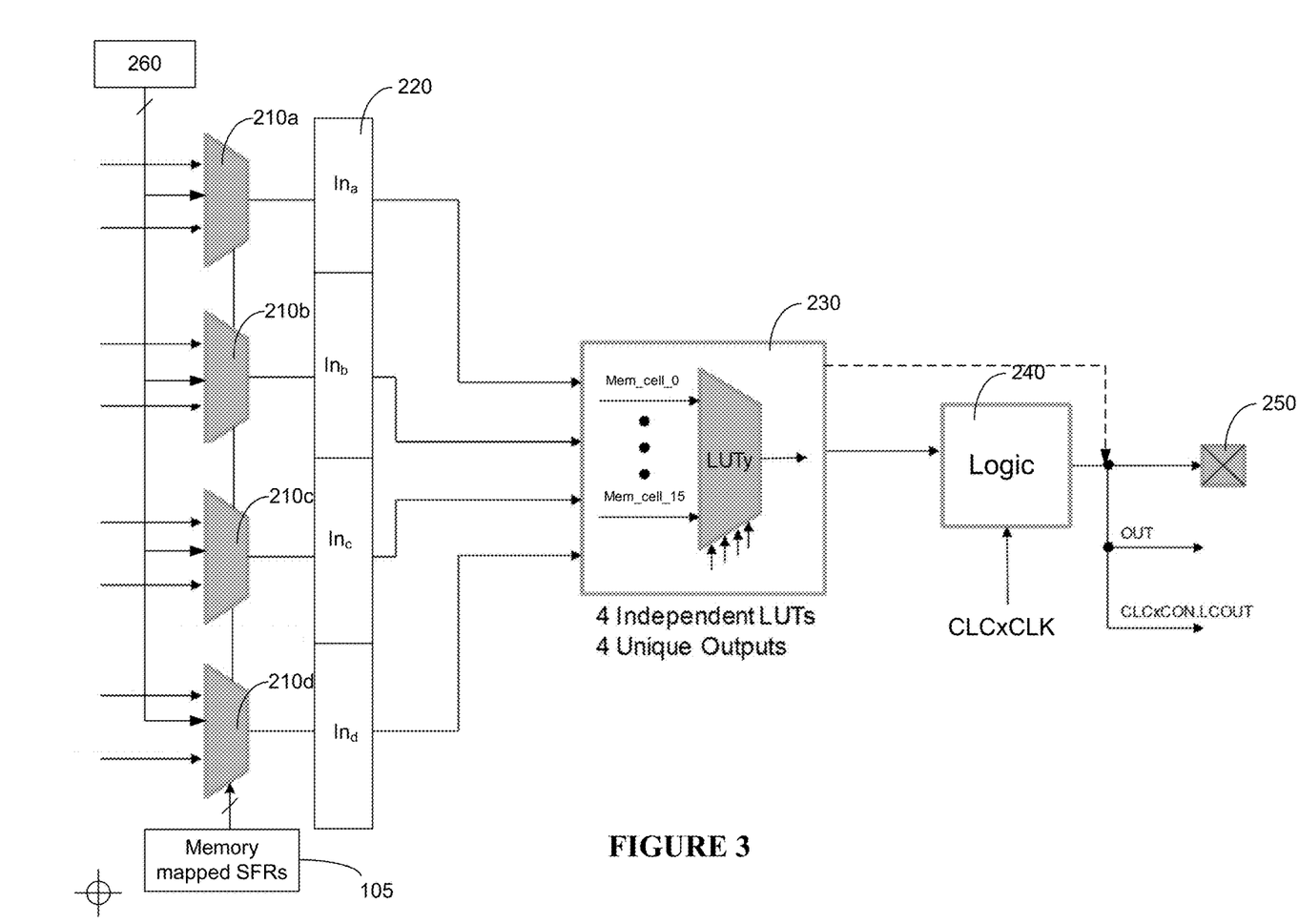
FIG. 3 shows a first embodiment of a look-up table—configurable logic cell peripheral.

According to various embodiments, as for example shown in FIG. 3, conventional CLC combinational logic elements as shown in FIG. 2 with MODE are replaced with one or more Lookup Table (LUT) elements 230 (only one shown). FIG. 3 indicates that, according to an embodiment, four LUT elements 230 can be implemented in a single LUT-CLC peripheral within a microcontroller. The LUT definition is configured by software as mentioned above. The multiple LUTs provided can be configured for parallel, unique input processing and result signals can be used to control sequential logic elements 240 (only one shown) with more intricate functions (e.g., JK flip flop with 4 inputs). LUT inputs can come from pins, peripherals, and in addition from a register or latch 220 which allows direct software control. This register or latch 220 operates as a buffer which is accessible by the CPU. As shown in the embodiment of FIG. 3, four input signals for LUT 230 will be selectable through multiplexers 210$a$ . . . $d$ and provide respective addresses to the a LUT 230. Similar input selection circuitry is provided when more than one LUT is implemented. Thus, four selection circuits would be implemented for four LUTs. These four signals are the address signal for the LUTs 230 that each select the output of for example one of sixteen 1-bit memory cells Mem_cell0 . . . Mem_cell_15. Each LUT 230 thus selects through the four address signals the respective memory cell content and provides its respective output signal to subsequent configurable sequential logic 240 or output pin 250. This output signal could form the output signal available at pin 250 of the LUT-CLC according to an embodiment as indicated by the dashed line for one of the LUTs 230. However, as shown in FIG. 3, a configurable sequential logic 240 may be provided for each LUT 230 which under CPU control may provide further functions as will be explained in more detail below. An output signal of the configurable sequential logic 240 is then fed to the external pin 250. The output signal of each LUT 230 or the output signal available at the output of configurable sequential logic 240 can also be made available internally as one or more internal signals OUT, CLCxCON.LCOUT for other internal modules as shown in FIG. 3. Configurable sequential logic 240 may receive a selectable clock signal CLCxCLK or other control signal for further synchronization or other purposes.

According to an embodiment, for example, a specific four bit input register 220 receiving a selected input signal through multiplexers 210a . . . d can be provided. As shown in FIG. 3, this register 220 is placed between the input selection multiplexers 210a . . . d and LUT 230. Each register bit $In_{a \ldots d}$ of register 220 is associated with one of the four inputs for a LUT. These registers may be memory mapped to the data memory of memory block 103 and thus a read or write can be performed on them through the CPU 102. Thus, the CPU 102 can not only read the current selected input signals provided to the LUT 230 but can override such signals thereby providing software control. Alternatively, or in addition memory-mapped special function registers (SFR) 260 are provided which could be selected as an input signal source for multiplexers 210a . . . d to provide a direct software input to LUT 230. All multiplexers 210 are individually controllable to provide any four input signals to the LUT 230 as desired. Other embodiments may have more or less than four input address signals and the associated LUTs 230 may therefore be more or less complex.

User-configuration of the LUT 230 allows for functionally-equivalent backwards compatibility to existing CLC peripherals, as well as permitting realization of arbitrary logic functions. This means most, if not all, multi-CLC combo-logic circuits, as for example shown in FIG. 2, can be replaced with a single LUT solution. LUT input from register 220 or 260 adds more flexibility compared to conventional logic cell peripherals.

Figure 4:
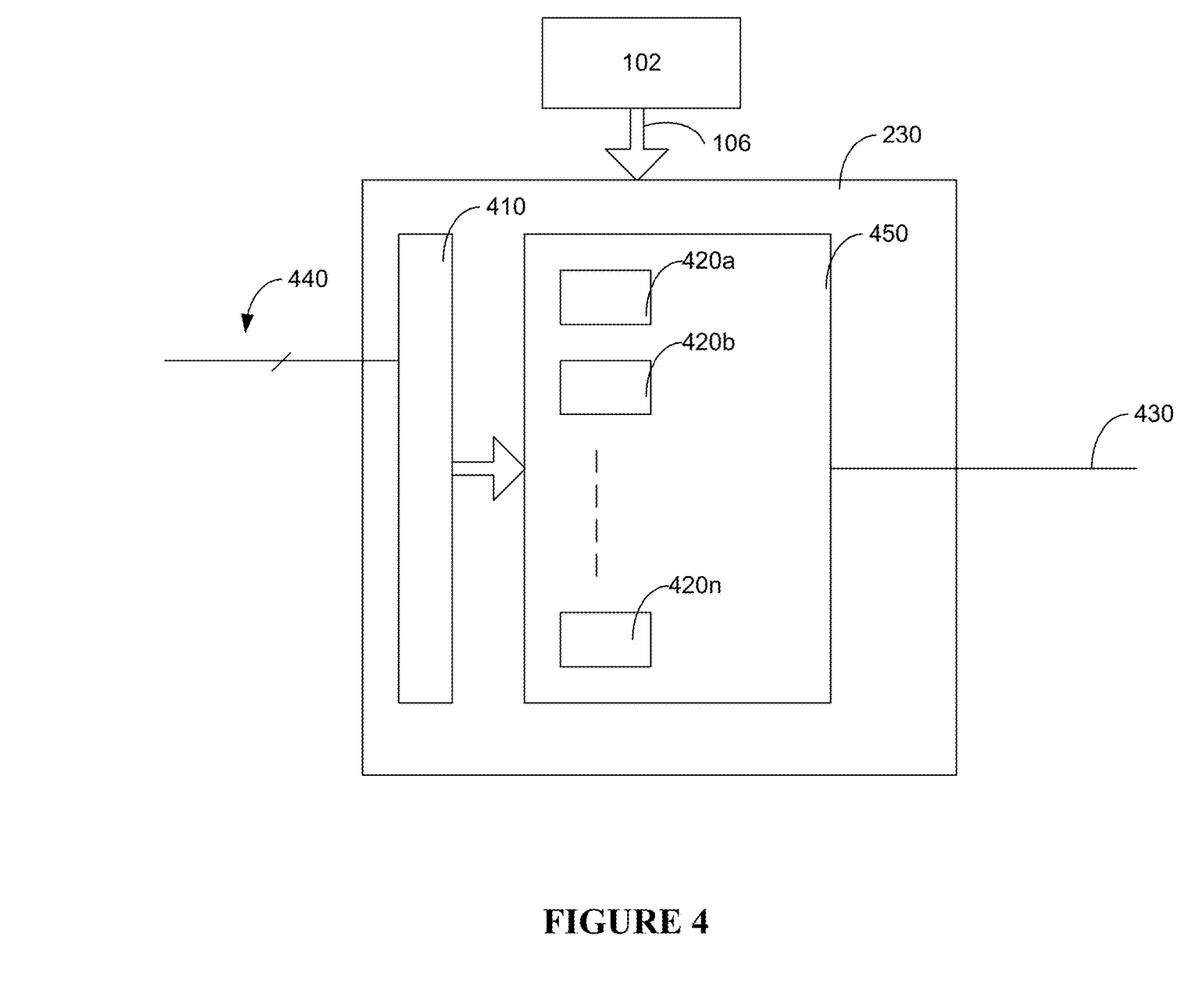
FIG. 4 shows a block diagram of an exemplary look-up table.

FIG. 4 shows a more detailed example of a LUT 230. The LUT 230 in this example comprises a memory block 450 with n 1-bit memory cells 420a . . . n and an address decoder 410 receiving a plurality of address lines 440. The address decoder 410 selects one of the memory cells 420a . . . b according to a supplied address whose output signal is them placed on output line 430. CPU 102 may have access to the memory cells 420a . . . n to provide direct read and write functionality. However, such access may also be provided through memory mapping of the memory cells 420a . . . n into the address space of the data memory or the flash memory of memory block 103. Alternatively to an address decoder 410, in particular in small LUTs, a simple multiplexer as indicated in FIG. 3 within block 230 may be used that selects one of multiple memory cells. Any other conventional look-up table circuit may be implemented according to various embodiments.

Figure 5:
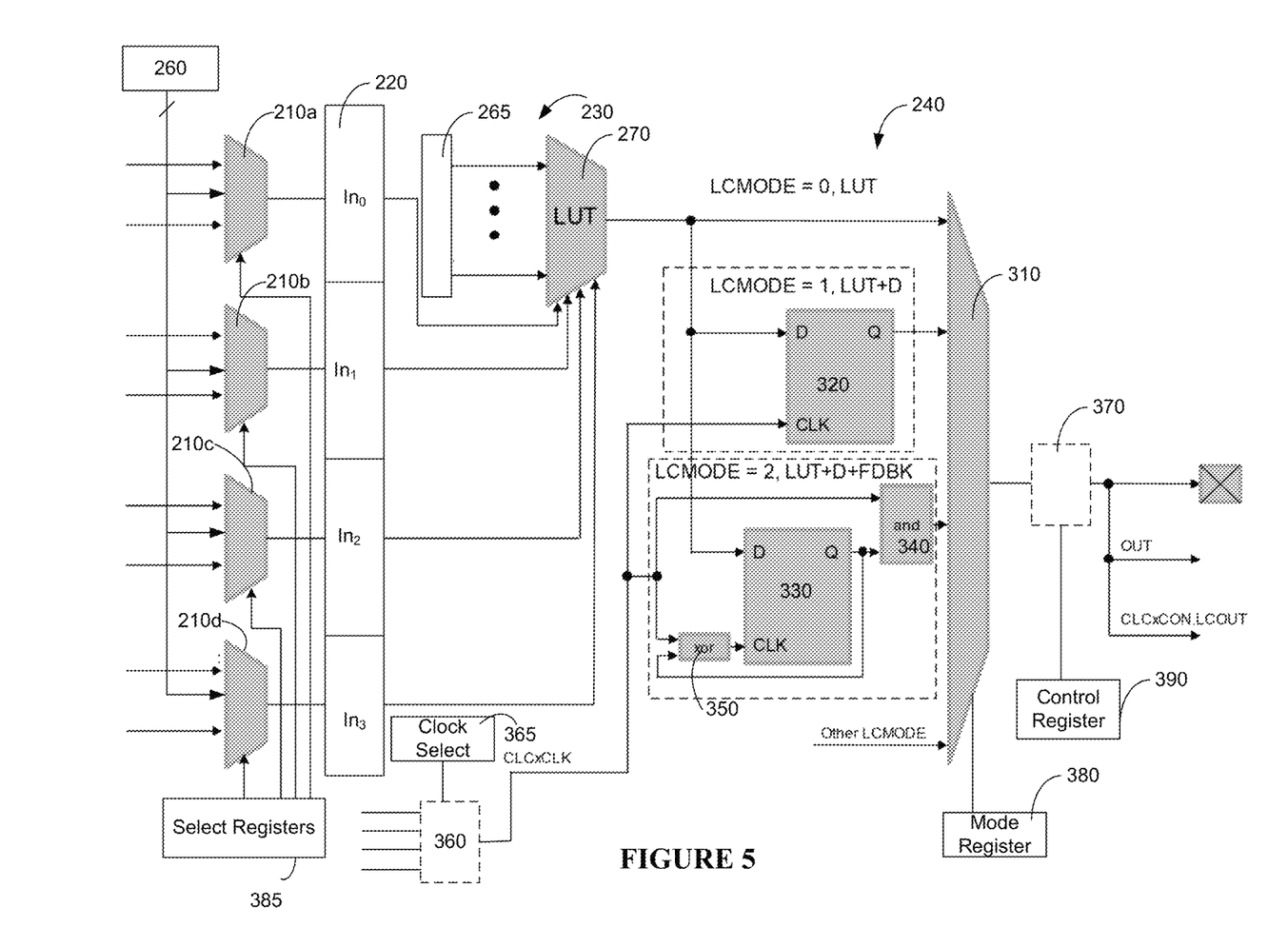
FIG. 5 shows a second embodiment of a look-up table—configurable logic cell peripheral.

According to a specific embodiment, a LUT 230 can be formed by a 16 cell, 1 bit word RAM that is addressed by a 4 bit selection circuit as shown in FIGS. 3 to 5. For example, according to an embodiment, each of the 4 address input lines are connected to a multiplexer circuit comprising for example four multiplexers 210a . . . d that allows four input bits to be taken from many different sources. FIG. 3 only shows three inputs for each multiplexer. However, a plurality of different signals may be selected by these multiplexers. Moreover, each multiplexer 210 a . . . d may receive different or identical set of input signals. In some embodiments, subsets of the input signals for the multiplexers 210a . . . d may overlap.

When looking to implement register input, this can be accomplished by either adding a register 260 to the selection list of the multiplexer circuit as shown in FIG. 3, or by putting a register 220 in between the outputs of multiplexers 210a . . . d and the respective LUT inputs as shown in FIGS. 3 and 5. In the second manner, the register 220 takes dominance over the LUT input line and acts as a buffer allowing for easy overriding of hardware signals by software. To this end, the CPU 102 can, for example, overwrite any content of register 220 during run-time. As mentioned above, both registers 220 and 260 may be implemented according to an embodiment. All registers may be memory mapped to the data memory.

This solution according to some embodiments provides 4 fully qualified inputs to a sixteen element LUT 230. This allows any function of 4 variables to be realized. The input multiplexers 210a . . . d may each have identical selection thereby forming a symmetrical input selection wherein each multiplexer 210a . . . d may have more or less input signals than the three signals shown in FIG. 3. However, other solutions may only provide, for example, a number of inputs that are not symmetrical, i.e. each input multiplexer 210a . . . d may receive a different set of input signals. In the embodiment of FIG. 3, this means only limited functions of 3 variables could be realized. Other embodiments may implement a higher number of input lines per input multiplexer 210a . . . d and/or a higher number of input signals to the LUT 230 which increases the number of memory cells needed to implement the LUT 230.

Inputs from register 220 and/or 260 allow for software control. Users who wish to generate events off of multiple disjointed peripherals can do so in software and signal that event to the LUT 230 via writing the input register 220/260. Also, a peripheral like a DMA 140 (shown in FIG. 1) can write to registers 220/260 which means the LUT-CLC can even maintain core-independence while using this feature.

FIG. 5 shows more details of a possible implementation of the configurable sequential logic 240. The LUT 230 is here again implemented as a multiplexer 270 and sixteen 1-bit memory cells 265. Input multiplexers 210a . . . d may receive a plurality of internal/external signals (only two shown in FIG. 5) and are controlled by select registers 385 which are part of the special function registers 105. Registers 220 and 260 are identical to register 220 and 260 of FIG. 3, respectively.

A mode multiplexer 310 receives the output signal of LUT 230 directly to a first input thereof. Mode multiplexer 310 may be controlled by register 380 which again may be part of the special function registers 105. A second input of mode multiplexer 310 receives an output signal from D-Flip Flop 320 whose input is coupled with the output of LUT 230. D-Flip Flop 320 is clock driven and receives a clock signal CLCxCLK which may be selectable from available internal clocks through a multiplexer 360 controlled by clock select register 365 which again may be part of the special function registers 105. A third input of mode multiplexer 310 receives an output of AND gate 340 whose first input receives the selectable internal clock signal CLCxCLK and whose second input received the output signal of D-Flip-Flop 330. The D-Flip-Flop 330 receives the output signal of LUT 230 as an input signal and comprises a clock input coupled with an output of XOR gate 350. XOR gate 350 receives the clock signal CLCxCLK and the output signal of D-Flip Flop 330. D-Flip Flops 320 and 330 may be implemented separately or a single D-Flip-Flop may be used and shared for the two operating modes. A fourth or more inputs of mode multiplexer 310 may, or may not, be provided and can provide further sequential logic and therefore LCMODEs as desired. The embodiment of FIG. 5 shows three possible LCMODEs, wherein the first LCMODE=0 has no sequential logic, the second LCMODE=1 provides for the LUT plus D-Flip Flop mode and the third LCMODE=2 for the LUT plus D-Flip Flop and feedback mode. This third operating mode provides for sequential logic for implementing glitch filtering whereby conventional microcontrollers with CLCs would need 3 CLCs to accomplish this, while embodiments of the present application can accomplish this task with a single cell. Any number of operating modes with respect to additional sequential logic may be implemented and none of the shown modes LCMODE=1 or 2 is required.

Mode multiplexer 310 may is controlled by mode register 380 which may be one of the configuration registers 105 and determines the respective LCMODE. Input selection multiplexers 210 is controlled by select register 385 which may be another configuration register of SFRs 105. Further logic 370 controlled by yet another SFR 105 may be provided to condition the output signal of mode multiplexer 310. Logic 370 controlled by control register 390 may provide an inverter, open drain control, controllable pull up or pull down resistors and similar functions and may be entirely omitted according to various embodiments. Control register 390 again may be part of the special function registers 105. Certain SFRs 105 may share functions as desired. For example, a single 32 bit SFR may control all or some configuration options. Each bit of register of the SFR 105 may be associated with turning on or off a specific function or option. Multiple bits or groups of bits in a register of SFR 105 can be used for controlling the input selection multiplexers 210 and the mode multiplexer 310 depending on the complexity of the implementation. However, separate registers 385, 380, 365, 390 as shown in FIG. 5, may be used for the input selection, configuration of the configurable logic 240, logic 370 and clock selection 360.

The invention claimed is:

1. A microcontroller comprising a central processing unit, memory, I/O ports and a plurality of peripheral units, wherein one of the peripheral units is a configurable logic cell, wherein the configurable logic cell is formed by a look-up table formed by a plurality of memory cells receiving a predefined number of input address signals selectable from internal signals provided by the peripheral units and at least one external signal provided by at least one external pin and generating an output signal and wherein the central processing unit is configured to directly provide input address signals for the look-up table.

2. The microcontroller according to claim 1, wherein the configurable logic cell comprises an input multiplexer circuit configured to select the predefined number of input address signals from said internal signals and the at least one external signal and further comprises a special function input register coupled between outputs of the input multiplexer circuit and an address input of the look-up table, wherein the special function input register receives and buffers the selected input signals and wherein the central processing unit is configured to read from and write to the special function input register.

3. The microcontroller according to claim 2, wherein the special function register is memory mapped to a data memory.

4. The microcontroller according to claim 2, wherein the configurable logic cell comprises an input multiplexer circuit configured to select the predefined number of input signals from said internal signals and the at least one external signal and further comprises a further special function input register coupled with inputs of the input multiplexer circuit wherein the central processing unit is configured to read from and write to the further special function input register to directly provide input signals to the look-up table.

5. The microcontroller according to claim 4, wherein the further special function register is memory mapped to a data memory.

6. The microcontroller according to claim 1, wherein the configurable logic cell comprises an input multiplexer circuit configured to select the predefined number of input signals from said internal signals and the at least one external signal and further comprises a special function input register coupled with inputs of the input multiplexer circuit wherein the central processing unit is configured to read from and write to the special function input register to directly provide input signals to the look-up table.

7. The microcontroller according to claim 6, wherein the special function register is memory mapped to a data memory.

8. The microcontroller according to claim 1, wherein the look-up table comprises a plurality of 1-bit memory cells.

9. The microcontroller according to claim 8, wherein the plurality of 1-bit memory cells are memory-mapped to the data memory.

10. The microcontroller according to claim 8, wherein the plurality of 1-bit memory cells are memory-mapped to the program memory.

11. The microcontroller according to claim 10, wherein the program memory is flash memory.

12. The microcontroller according to claim 8, further comprising a direct memory access controller configurable to transfer data into the plurality of 1-bit memory cells.

13. The microcontroller according to claim 8, further comprising a multiplexer having a plurality of inputs coupled with the plurality of 1-bit memory cells, wherein the multiplexer is controlled to select an output of one of the memory cells corresponding to said input address signals.

14. The microcontroller according to claim 8, further comprising an address decoder configured to select one of the memory cells corresponding to input address signals received at the address decoder.

15. The microcontroller according to claim 1, further comprising a logic circuit being coupled with an output of the look-up table.

16. The microcontroller according to claim 15, wherein the logic circuit comprises a mode multiplexer having a first input coupled with the output of the look-up table, a second input coupled with an output of a first flip-flop, wherein a data input of the first flip flop is coupled with the output of the look-up table and a clock input of the flip-flop is coupled with a clock input of the logic circuit, wherein the mode multiplexer is controlled by a mode register.

17. The microcontroller according to claim 16, wherein the multiplexer comprises a third input coupled with an output of an AND gate, the AND gate having a first input coupled with the clock input and a second input coupled with an output of a second flip-flop, wherein a data input of the second flip-flop is coupled with output of the look-up table and a clock input of the second flip-flop is coupled with an output of an XOR gate, wherein a first input of the XOR gate is coupled with the clock input and a second input of the XOR gate is coupled with the output of the second flip-flop.

18. A method of operating a microcontroller comprising a central processing unit, memory, I/O ports and a plurality of peripheral units, wherein one of the peripheral units is a configurable logic cell, wherein the configurable logic cell is formed by a look-up table formed by a plurality of memory cells receiving a predefined number of input address signals and generating an output signal and wherein the central processing unit is configured to directly provide input address signals for the look-up table, the method comprising:

- configuring the look-up table by loading predefined data into memory cells of the look-up table;
- selecting address signals from internal signals provided by the peripheral units and external signals provided by at least one external pin;
- buffering the selected address signals in a register or latch.

19. The method according to claim 18, further comprising overwriting the register or latch by the central processing unit under program control.

20. The method according to claim 18, wherein configuring the look-up table is performed by transferring data into the memory cells by the central processing unit or a DMA controller.

21. The method according to claim 18, wherein configuring the look-up table is performed by memory-mapping the memory cells to a flash memory and by programming the microcontroller.

* * * * *